United States Patent [19]
Kawazoe

[11] Patent Number: 5,844,234
[45] Date of Patent: Dec. 1, 1998

[54] AMPLIFICATION TYPE SOLID-STATE IMAGING DEVICE HAVING A CENTER OF THE SOURCE REGION DISPLACED FROM A PIXEL CENTER

[75] Inventor: Hidechika Kawazoe, Kitakatsuragi-gun, Japan

[73] Assignee: Sharp Kabushiki Kaisha, Osaka, Japan

[21] Appl. No.: 812,409

[22] Filed: Mar. 5, 1997

[30] Foreign Application Priority Data

Mar. 6, 1996 [JP] Japan .................................... 8-049332

[51] Int. Cl.⁶ .............................. H01J 40/14; H04N 3/14
[52] U.S. Cl. .................................. 250/208.1; 250/214.1; 257/232; 257/291; 348/294
[58] Field of Search ................................ 250/208.1, 214; 257/232, 233, 291–293; 348/294, 320, 311

[56] References Cited

U.S. PATENT DOCUMENTS

| | | | |
|---|---|---|---|
| 5,308,969 | 5/1994 | Okada et al. | 250/208.1 |
| 5,416,345 | 5/1995 | Matsunaga | 257/232 |
| 5,420,634 | 5/1995 | Matsumoto | 348/311 |
| 5,430,312 | 7/1995 | Yamada | 257/291 |
| 5,712,497 | 1/1998 | Watanabe et al. | 257/291 |
| 5,726,710 | 3/1998 | Hynecek | 348/311 |

FOREIGN PATENT DOCUMENTS 8-78653  3/1996  Japan .
8-250697  9/1996  Japan .

OTHER PUBLICATIONS

T. Nakamura et al., "Gate accumulation type MOS Phototransistors Image Sensors", 1986 *Television Society National Meeting*, published 1986, pp. 57–58 (with partial English translation).

K. Matsumoto et al., "The Operation Mechanism of a Charge Modulation Device (CMD) Image Sensor", *IEEE Transactions on Electron Devices*, vol. 38, No. 5, May 1991, pp. 989–998.

*Primary Examiner*—Stephone Allen
*Attorney, Agent, or Firm*—Dike, Bronstein, Roberts & Cushman, LLP; David G. Conlin; Brian L. Michaelis

[57] ABSTRACT

An amplification type solid-state imaging device according to the present invention includes: a first gate region functioning as a photoelectric conversion region, a second gate region, and a source region, the first gate region surrounding the source region, and the second gate region adjoining the first gate region on a side opposite the source region, to discharge signal charge accumulated in the first gate region through the second gate region. The center of the source region is displaced from the center of a pixel.

15 Claims, 11 Drawing Sheets

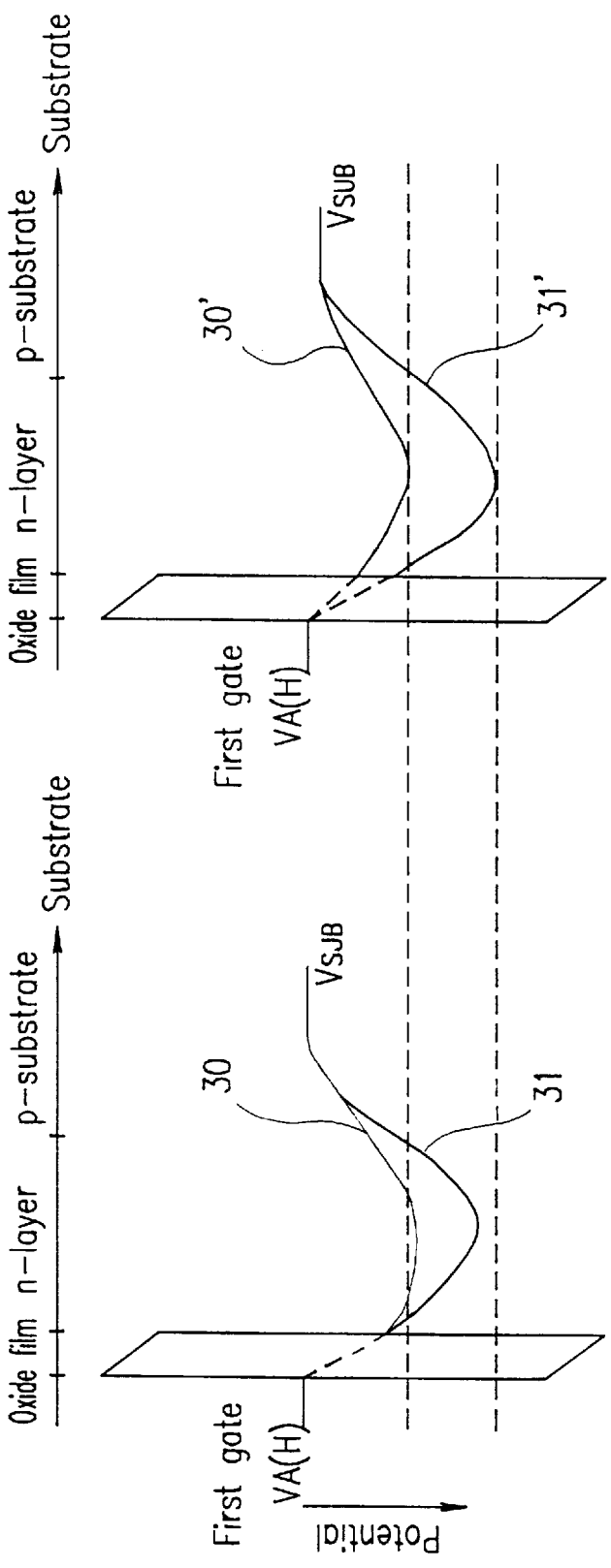

AMPLIFICATION TYPE SOLID-STATE IMAGING DEVICE HAVING A CENTER OF THE SOURCE REGION DISPLACED FROM A PIXEL CENTER

BACKGROUND OF THE INVENTION

1. Field of the Invention

The present invention relates to an amplification type solid-state imaging device, and more particularly to an amplification type solid-state imaging device having a low driving voltage and excellent pixel characteristics.

2. Description of the Related Art

Currently, CCDs (charge coupled devices) are the most prevalent type of solid-state imaging devices. A CCD solid-state imaging device subjects incident light to photoelectric conversion by means of a photodiode or an MOS (metal oxide semiconductor) diode and directs the accumulated signal charge to a highly sensitive charge detection section via a CCD transfer channel so that the signal charge is converted into a voltage signal. CCD solid-state imaging devices have advantages associated therewith such as a high S/N (signal to noise) ratio and a high output voltage level.

However, the pixel size must be decreased as the size of the solid-state imaging device is decreased and as the number of pixels is increased, which results in a smaller transferrable charge amount to the CCD. This has led to the problem of a considerably small dynamic range. Furthermore, it is generally the case that the entire CCD is driven by a few edges of a clock signal, which results in a large load capacitance and a high driving voltage. Consequently, power consumption drastically increases as the number of pixels increases.

In an attempt to overcome the above-mentioned problems, so-called amplification type solid-state imaging devices have been proposed. Instead of directly reading the signal charge generated in each pixel, an amplification type solid-state imaging device amplifies the signal charge in each pixel before the signal charge is read by a scanning circuit. Amplification type solid-state imaging devices are more advantageous in terms of dynamic range than CCDs since the process of reading does not impose a substantial limit to the resultant signal amount. Moreover, an amplification type solid-state imaging device is driven with respect to each horizontal/vertical scanning line including the pixel of interest (i.e., the pixel from which a signal is to be read). As a result, an amplification type solid-state imaging device has a lower driving voltage and therefore smaller power consumption than that of a CCD.

In general, the amplification in each pixel is performed by a transistor. Depending on the particular type of transistors employed for amplification, the amplification type solid-state imaging devices can be classified into SIT (silicon intensifier target) type devices, bipolar type devices, MOS type devices, etc. Since the scanning circuit for reading signals is preferably constructed as a MOS type circuit because of the relatively easy construction, it is preferable to adopt MOS type transistors also for the amplification in each pixel so that both the scanning circuit and those transistors can be formed in a monolithic manner. Thus, MOS type amplification type solid-state imaging devices are preferred with respect to the entire device construction.

Among amplification type solid-state imaging devices incorporating MOS type transistors, devices which include only one MOS transistor for each pixel are preferred for an increased pixel density. CMD (charge modulation device) type, FGA (floating gate amplifier) type, and BCMD (bulk charge modulation device) type pixels have been reported as suitable for devices of this type.

FIGS. 6A and 6B show an example of a CMD type pixel. This CMD type pixel is described in Nakamura et al. "GATE ACCUMULATION TYPE MOS PHOTOTRANSISTORS IMAGE SENSORS", 1986 Television Society National Meeting, p.57. Hereinafter, the general structure of this pixel will be described.

As shown in FIG. 6B, an n-type well layer 16 is formed as a buried channel on a p-type semiconductor substrate 15. A gate electrode 17 is formed on the n-type well layer 16 with an insulating film (e.g., an oxide film; not shown) interposed therebetween. A source 18 and a drain 19 are formed in the n-type well layer 16. The source 18 and the drain 19 are composed of high-density n layers ($n^+$ layers) separated from each other by the gate electrode 17.

In the case where the above-described CMD type pixels are adopted in a two-dimensional image sensor device, as shown in FIG. 6A (where the relationship between the horizontal direction and the vertical direction is shown reversed, i.e., rotated by 90°), each horizontal row of gate electrodes 17 are coupled in common to a clock line VG(i), VG(i+1), ..., etc., whereas each vertical row of sources 18 are coupled in common to a signal line VS(i), VS(i+1), ..., etc. A drain voltage VD is applied to each drain 19 in the periphery of each pixel.

Next, the operation of the CMD type pixel is described with reference to FIG. 7. First, a relatively low gate voltage VL is applied to the gate electrode 17 during the period of signal accumulation so that the signal charge (holes) generated through the photoelectric conversion is accumulated at an interface between the semiconductor and the insulating film. The electrons are lost through the drain 19 during this period. Next, when the signal is to be read, the gate voltage is increased to an intermediate level VM. As a result, the current flowing between the drain 19 and the source 18 changes in accordance with the change of signal charge. The level of the current is read as a signal output. The current in the other pixels on the same signal line is not detected because their gate electrodes 17 are at the VL level.

When resetting the pixel, i.e., the signal charge is cleared so as to prepare for the next instance of signal accumulation. The gate voltage is increased to a relatively high level VH. As a result, a potential gradient shown in FIG. 7, which monotonously descends (decreases) in the depth direction, is obtained. As a result, the signal charge accumulated in the semiconductor/insulating film interface is drained to the immediately underlying semiconductor substrate 15, as indicated by the broken line in FIG. 6B.

The CMD type pixel has a problem in that it is difficult to realize an amplification type solid-state imaging device having a low driving voltage with CMD type pixels. The reason is that the CMD type pixel requires the buried channel to be highly dense in order to increase the density of signal charge accumulation. Such a buried channel inevitably requires a very high gate voltage during the reset operation.

In order to solve the above-mentioned problem, a TGMIS (twin gate MOS image sensor) type amplification type solid-state imaging device has been proposed, for example, in Japanese Patent Application No.6-303953 filed by the present Applicant. The TGMIS type amplification type solid-state imaging device subjects incident light to an photoelectric conversion in a gate region of an MOS type transistor formed on a semiconductor substrate. The change in the potential of the MOS transistor, varying in response to a signal charge accumulated in the gate region, is output from this device.

The TGMIS type amplification type solid-state imaging device is described with reference to FIGS. 8A and 8B. As shown in FIG. 8B, an n-type well layer 23 is formed on or near the surface of a p-type semiconductor substrate 20. A first gate electrode 21 is formed on the well layer 23 with a gate insulating film (e.g., an oxide film; not shown) interposed therebetween. The first gate electrode 21 defines a first gate region, which functions as a photoelectric conversion region. A source (source region) 24 and a drain (drain region) 25 are formed in the well layer 23. The source 24, the drain 25, and the first gate electrode 21 constitute a MOS type transistor. The source 24 and the drain 25 are composed of high-density n layers ($n^+$ layers).

The present specification conveniently employs the terms "source" and "source region", and "drain" and "drain region" as necessitated by each context.

Furthermore, a second gate electrode 22 is formed on the semiconductor substrate 20, with an insulating film interposed therebetween, so as to adjoin the first gate electrode 21. The second gate electrode defines a second gate region. As shown in FIG. 8A (where the relationship between the horizontal direction and the vertical direction is shown reversed, i.e., rotated by 90°), the first gate region (functioning as a photoelectric conversion region) is formed so as to center around the source 24. Each horizontal row of first gate electrodes 21 are coupled in common to a clock line VA(i), VA(i+1), . . . , etc. Each horizontal row of second gate electrodes 22 are coupled in common to a clock line VB(i), VB(i+1), . . . , etc. Each vertical row of sources 24 are coupled in common to a signal line VS(j), VS(j+1), . . . , etc. A drain voltage VD is applied to each drain 25 in the periphery of each pixel.

A reset operation of the TGMIS device having the above structure is described. As used herein, a "reset operation" is defined as draining a signal charge. In the above-described device, the signal charge (holes) generated through the photoelectric conversion is accumulated at an interface between the semiconductor and the insulating film in the first gate region. The signal charge is drained to the semiconductor substrate 20 via the second gate region so that the accumulated signal charge is eliminated. Thus, a reset operation has been performed.

In accordance with the above TGMIS type amplification type solid-state imaging device, a reset channel is formed on or near the surface of the semiconductor substrate 20 immediately under the second gate electrode 22 so that the signal charge can be easily reset by only decreasing slightly the potential barrier via application of a predetermined voltage to the second gate electrode 22. Thus, it becomes possible to decrease the gate voltage during the reset operation. As a result, this TGMIS type amplification type solid-state imaging device solves the above-mentioned problem inherent to the CMD type pixel.

However, the above TGMIS type amplification type solid-state imaging device has the following problems.

In the TGMIS type amplification type solid-state imaging device, each source region 24 is formed so as to have a square shape as viewed from above (see FIG. 8A) having a center that coincides with the center 7 of each pixel (see FIG. 8B). Furthermore, one end of the drain 25 adjoins an end of the photoelectric conversion region lying under the first gate electrode 21. Because the distance between the source region 24 and the drain 25 of the pixel is not equal to the distance between the source region 24 and the drain 25 of an adjoining pixel (i.e., adjoining the second gate electrode 22), the semiconductor surface of the first gate region has unequal distributions within the pixel as shown in FIG. 9.

FIG. 9 illustrates a signal charge accumulation operation with respect to potential distributions (26' and 27') along the depth direction in the case where no signal charge has been accumulated. As shown in FIG. 9, the potential distribution 26' under a portion of the first gate electrode 21 interposed between the source 24 and the second gate electrode 22 is different from the potential distribution 27' under a portion of the first gate electrode 21 interposed between the source 24 and the drain 25. This amplification type solid-state imaging device operates as follows, for example: A relatively low gate voltage VA(L) (=−3.0 V) is applied to the first gate electrode 21 and an intermediate voltage VB(M) (=1.0 V) is applied to the second gate electrode 22 during the period of signal charge accumulation. When there is no signal charge accumulated in this exemplary case, the surface potential taken under the portion of the first gate electrode 21 between the source 24 and the second gate electrode 22 is lower by 0.2 V from the surface potential taken under the portion of the first gate electrode 21 between the source 24 and the drain 25.

When signal charge (holes) has been generated in response to an irradiation of light, the signal charge having a tendency to gather at locations having low potential is likely accumulated under the portion of the first gate electrode 21 between the source 24 and the second gate electrode 22. However, when detecting the potential of the source 24 as a signal amount corresponding to the signal charge amount, the maximum value of the potential under the first gate electrode 21 is detected. Therefore, this device detects the maximum value of the potential under the portion of the first gate electrode 21 between the drain 25 and the source 24.

Thus, given that unequal potential distributions exist under the first gate electrode 21, the following problem can occur: When the signal charge amount accumulated within the pixel is small, the potential in the semiconductor under the portion of the first gate electrode 21 interposed between the drain 25 and the source 24 is not likely to change so as to adequately reflect the signal charge amount accumulated in the entire pixel, indicative of a low sensitivity for the signal charge amount. Accordingly, it is difficult for the above-mentioned TGMIS type amplification type solid-state imaging device to obtain a sensor output (source potential) that is in accordance with the generated signal charge, thereby resulting in inadequate detection accuracy.

Moreover, there has been an increasing demand for a larger number of pixels, as well as smaller size, of such amplification type solid-state imaging devices, so that it is necessary to reduce the pixel size itself. However, as the pixel size decreases, the drain 25 is disposed closer to the photoelectric conversion region. This results in a larger influence by the drain voltage, which increases the potential value under the first gate electrode 21. Therefore, in the case of a particularly small amplification type solid-state imaging device, there is a further problem in that the potential value is drawn closer to the drain voltage, thereby decreasing the dynamic range.

SUMMARY OF THE INVENTION

An amplification type solid-state imaging device according to the present invention includes: a first gate region functioning as a photoelectric conversion region, a second gate region, and a source region, the first gate region surrounding the source region, and the second gate region adjoining the first gate region on a side opposite the source region, to discharge signal charge accumulated in the first gate region through the second gate region; wherein a center of the source region is displaced from a center of a pixel.

In one embodiment of the invention, the first gate region is a portion of a transistor formed on or near a surface of a semiconductor substrate; the transistor outputs a change in an electric signal in accordance with the accumulated signal charge generated through a photoelectric conversion; the second gate region is formed on the surface of the semiconductor substrate; resetting of the signal charge in the second gate region occurs inside the semiconductor substrate.

In another embodiment of the invention, the first gate region is a portion of a transistor formed on or near a surface of a semiconductor substrate; the transistor outputs a change in an electric signal in accordance with the accumulated signal charge generated through a photoelectric conversion; the second gate region is formed on the surface of the semiconductor substrate; a reset drain is provided on or near the surface of the semiconductor substrate at an end adjoining the second gate region; resetting of the signal charge occurs in the reset drain via the second gate region; and the change in the electric signal is output by the transistor based on change occurring in a current flowing between the source region and the semiconductor substrate, the semiconductor substrate functioning as a drain.

In still another embodiment of the invention, the first gate region is a portion of a transistor formed on or near a surface of a semiconductor substrate; the transistor outputs a change in an electric signal in accordance with the accumulated signal charge generated through a photoelectric conversion; the second gate region is formed on the surface of the semiconductor substrate; and a reset drain is provided on or near the surface of the semiconductor substrate within the second gate region.

In still another embodiment of the invention, an electric field obstruction element is formed on or near the surface of the semiconductor substrate and its vicinity on a side of the second gate region opposite the adjoining first gate region.

In still another embodiment of the invention, the center of the source region is displaced from the center of the pixel toward the second gate region.

In still another embodiment of the invention, the source region has a shape such that a distance between the center of the pixel and of the source region closer to the second gate region is longer than a distance between the center of the pixel and the opposite end of the source region.

Thus, the invention described herein makes possible the advantages of (1) providing an amplification type solid-state imaging device capable of accurate detection such that a sensor output which is in accordance with the signal charge is obtained; (2) providing an amplification type solid-state imaging device having a broad dynamic range and therefore being suitable for an increased number of pixels and reduced device size; and (3) providing an amplification type solid-state imaging device having a low driving voltage and excellent pixel characteristics.

These and other advantages of the present invention will become apparent to those skilled in the art upon reading and understanding the following detailed description with reference to the accompanying figures.

BRIEF DESCRIPTION OF THE DRAWINGS

FIG. 3A is a potential distribution diagram illustrating a reading operation of the amplification type solid-state imaging device shown in FIGS. 1A and 1B, with respect to the potential distribution in a portion under the first gate region along the depth direction.

FIG. 3B is a potential distribution diagram illustrating a reading operation of a conventional amplification type solid-state imaging device, with respect to the potential distribution in a portion under the first gate region along the depth direction.

DESCRIPTION OF THE PREFERRED EMBODIMENTS

Hereinafter, the present invention will be described by way of illustrative embodiments. However, the present invention is not limited to such embodiments.

(Embodiment 1)

Figure 1A:
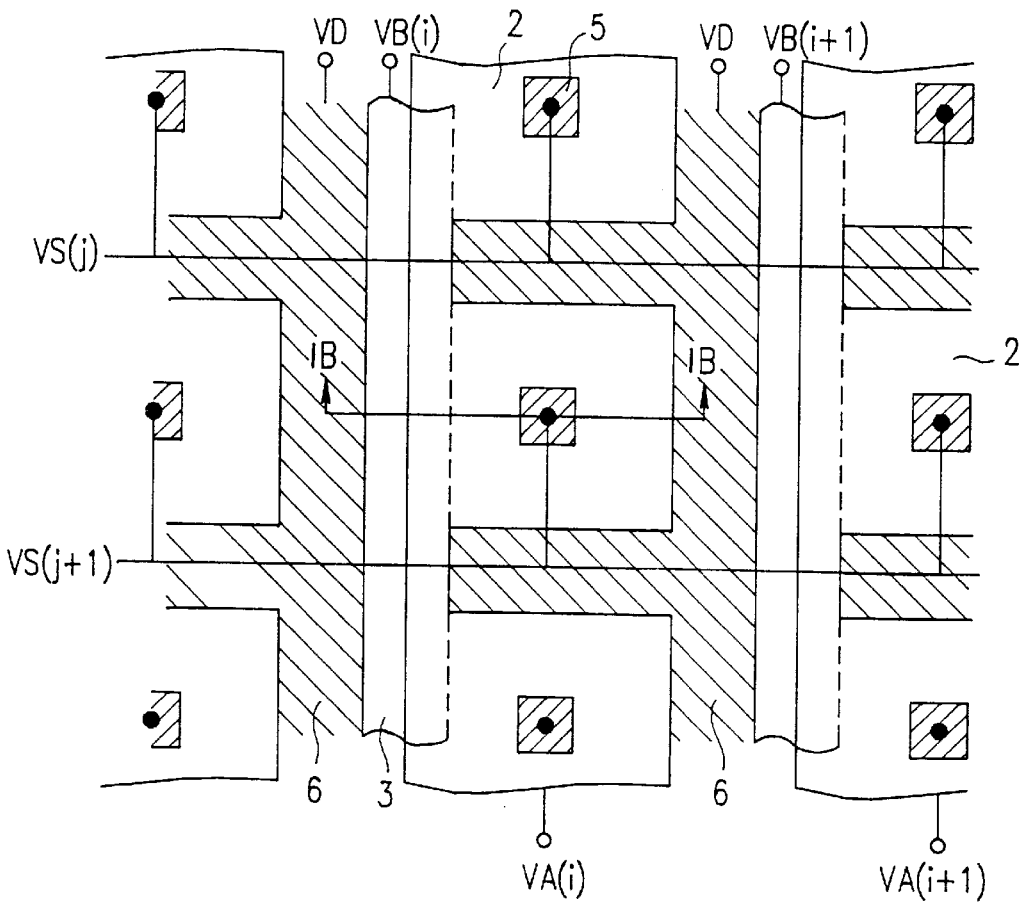
FIG. 1A is a schematic plan view showing an exemplary embodiment of an amplification type solid-state imaging device according to the present invention (where the relationship between the horizontal direction and the vertical direction is shown reversed, i.e., rotated by 90°).
Figure 1B:
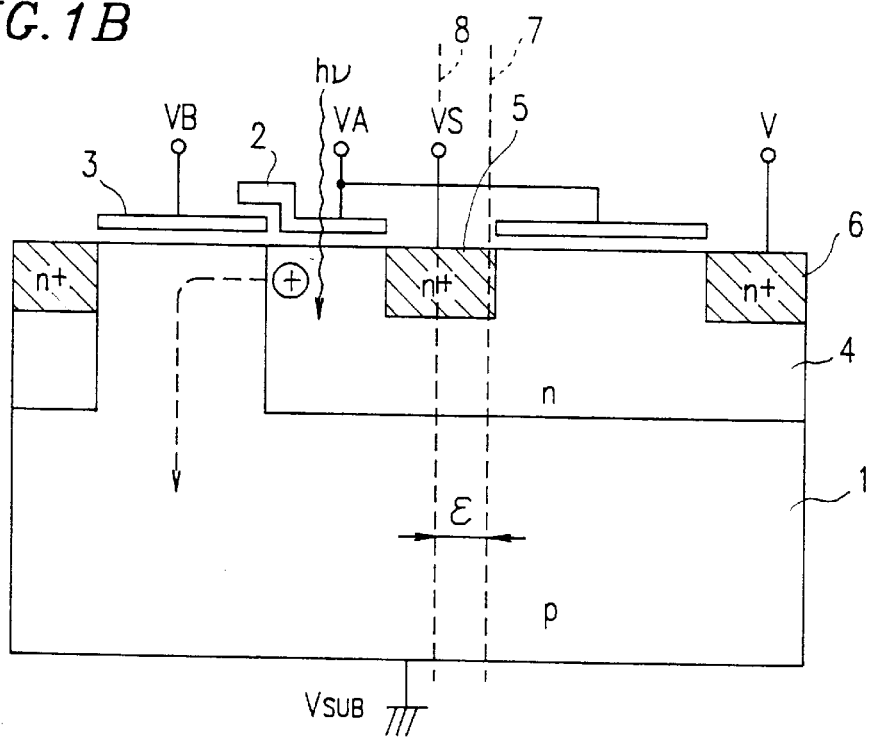
FIG. 1B is an enlarged cross-sectional view showing the amplification type solid-state imaging device in FIG. 1A taken at line B—B.

FIG. 1A is a schematic plan view showing an amplification type solid-state imaging device according to Embodiment 1 of the present invention (where the relationship between the horizontal direction and the vertical direction is shown reversed, i.e., rotated by 90°). FIG. 1B is an enlarged cross-sectional view taken at line B—B in FIG. 1A.

As shown in FIG. 1B, a first gate electrode (gate region) 2 and a second gate electrode (gate region) 3 are formed on a p-type semiconductor substrate 1 with a gate insulating film (not shown) interposed therebetween. One end of the second gate electrode 3 adjoins the first gate electrode 2. An n-type well layer 4 is formed on or near the surface of the semiconductor substrate 1 under the first gate electrode 2. A source (source region) 5 and a drain (drain region) 6 are formed in the well layer 4. The source 5, the drain 6, and the first gate electrode 2 constitute a MOS type transistor. The source 5 and the drain 6 are composed of $n^+$ diffusion layers.

As shown in FIG. 1A, the first gate region (functioning as a photoelectric conversion region) is formed around the source 5. Each horizontal row of first gate electrodes 2 are coupled in common to a clock line VA(i), VA(i+1), . . . , etc. Each horizontal row of second gate electrodes 3 are coupled in common to a clock line VB(i), VB(i+1), . . . , etc. Each vertical row of sources 5 are coupled in common to a signal line VS(j), VS(j+1), . . . , etc. A drain voltage VD is applied to each drain 6 in the periphery of each pixel.

The semiconductor substrate 1 can be composed of Si under the following conditions:
substrate density: $1 \times 10^{15}$ cm$^{-3}$
well layer density: $3 \times 10^{15}$ cm$^{-3}$
well layer thickness: 1.5 μm
gate insulating film thickness: 80 nm It is understood that there is no limitation in the present invention as to the type of gate electrodes used or the materials thereof. Any gate electrode configuration and/or material used in the art of amplification type solid-state imaging devices can be adopted.

As shown in FIG. 1B, the vertical center 8 of the source region 5 is displaced from the center 7 of the pixel (i.e., the center of the first gate electrode 2) by E in the direction of the second gate electrode 3. In contrast, in amplification type solid-state imaging elements used for conventional amplification type solid-state imaging devices (e.g., the above-mentioned TGMIS type amplification type solid-state imaging device previously proposed by the Applicant), the vertical center of the source region 5 coincides with the vertical pixel center 7.

The displacement ε can vary in accordance with the specific usage of the device, the pixel size, the applied voltage, and the like. For example, if the device is dimensioned so that the distance between the source region 5 and the second gate electrode 3 (taken from end to end) and the distance between the source region 5 and the drain region 6 (taken from end to end) both become 1.5 μm when the vertical center 8 of the source region 5 is aligned with the pixel center 7 (as in the conventional device), the appropriate displacement ε according to the present example (as complying with the other conditions described herein) is about 0.4 μm.

When light hυ enters through the first gate electrode 2 in the amplification type solid-state imaging device having the above structure, pairs of electrons and holes are generated through a photoelectric conversion. The electrons are lost to the drain 6, whereas the holes are accumulated at the interface between the semiconductor and the insulating film in the well layer 4 to form a signal charge. A predetermined constant voltage (i.e., 5 V in the present example) is applied to the drain 6.

The potential of the well layer 4 changes in accordance with the accumulated signal charge amount. The amplification type solid-state imaging device of the present invention reads and outputs the amount of change in the potential of the well layer 4 in the form of a change in the potential of the source 5. The discharging of the signal charge (i.e., resetting) is performed by draining the signal charge to the semiconductor substrate 1 along the path indicated by the broken arrow in FIG. 1B by lowering the potential barrier under the second gate electrode 3.

Hereinafter, the effect of the displacement ε of the center 8 of the source region 5 from the pixel center 7 is described with reference to FIG. 2. For conciseness, the description herein illustrates a case where a relatively low gate voltage VA(L) (=−3.0 V) is applied to the first gate electrode 2 and an intermediate voltage VB(M) (=1.0 V) is applied to the second gate electrode 3 during the period of signal charge accumulation.

Figure 8A:
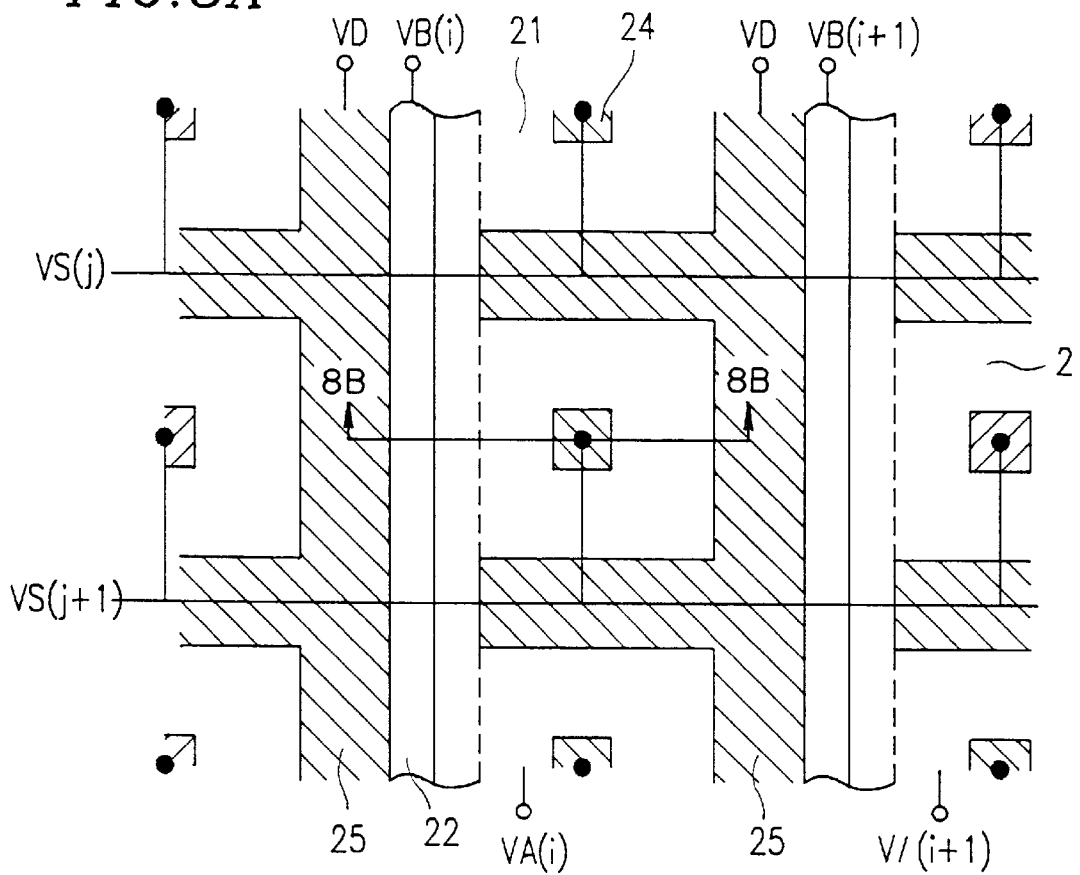
FIG. 8A is a schematic plan view illustrating a number of pixels in a TGMIS amplification type solid-state imaging device (where the relationship between the horizontal direction and the vertical direction is shown reversed, i.e., rotated by 90°).
Figure 8B:
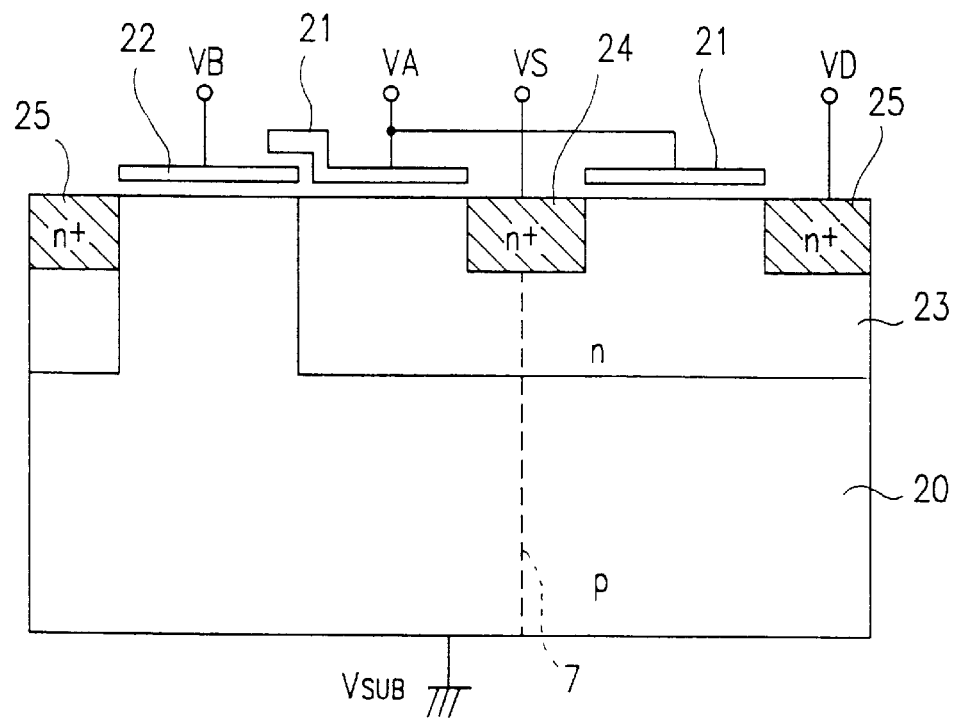
FIG. 8B is an enlarged cross-sectional view showing the TGMIS amplification type solid-state imaging device in FIG. 8A taken at line B—B.

As described earlier, when there is no signal charge accumulated in the case where the source 5 is provided near the pixel center 7 (i.e., the vertical center 8 of the source region 5 completely or substantially coinciding with the pixel center 7 as in the conventional amplification type solid-state imaging device shown in FIGS. 8A and 8B), the semiconductor surface potential taken under the portion of the first gate electrode 2 between the source 5 and the second gate electrode 3 is lower by 0.2 V than the semiconductor surface potential taken under the portion of the first gate electrode 2 between the source 5 and the drain 6. In other words, the semiconductor surface potential under the first gate electrode 2 has unequal distributions. As a result, the semiconductor potential does not change so as to adequately reflect the signal charge amount accumulated in the entire pixel, indicative of a low sensitivity for the signal charge amount.

On the contrary, as a result of the displacement ε of the vertical center 8 of the source region 5 from the vertical pixel center 7 in the direction of the second gate electrode 3 according to the present embodiment, when no signal charge has been accumulated, the potential of the semiconductor surface under the portion of the first gate electrode 2 between the source 5 and the second gate electrode 3 becomes deeper by 0.1 V than in the conventional configuration. This is due to the influence of the constant voltage (5.0 V) applied to the drain 6 adjoining the second gate electrode 3, owing to the decreased distance between the source 5 and the drain 6 adjoining the second gate electrode 3.

On the other hand, the portion of the first gate electrode 2 between the source 5 and the drain 6 (on the right of the source 5 in the figure) becomes shallower by 0.1 V than in the conventional configuration due to the reduced influence of the drain 6, owing to the increased distance between the source 5 and the drain 6.

Figure 2:
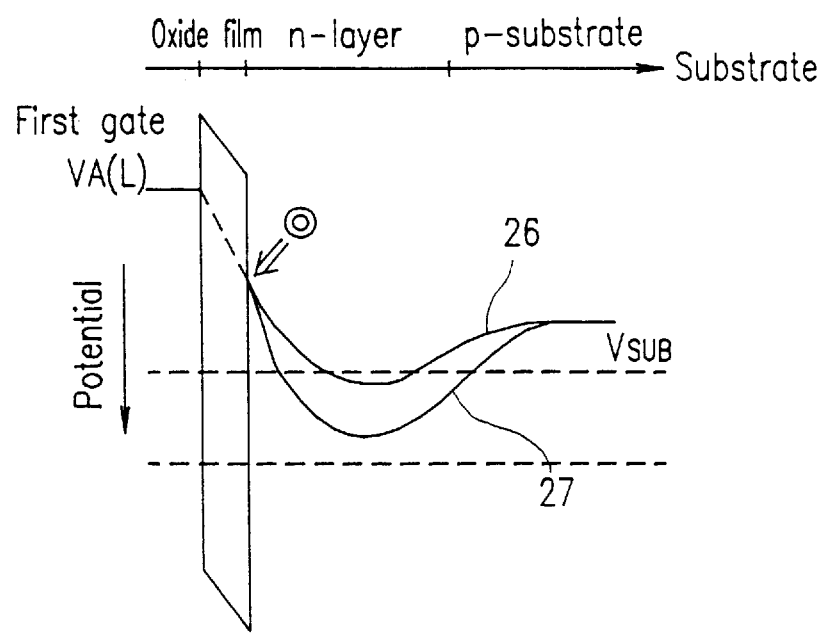
FIG. 2 is a potential distribution diagram illustrating a signal charge accumulation operation of the amplification type solid-state imaging device shown in FIGS. 1A and 1B, with respect to the potential distribution in a portion under a first gate region along the depth direction.
Figure 9:
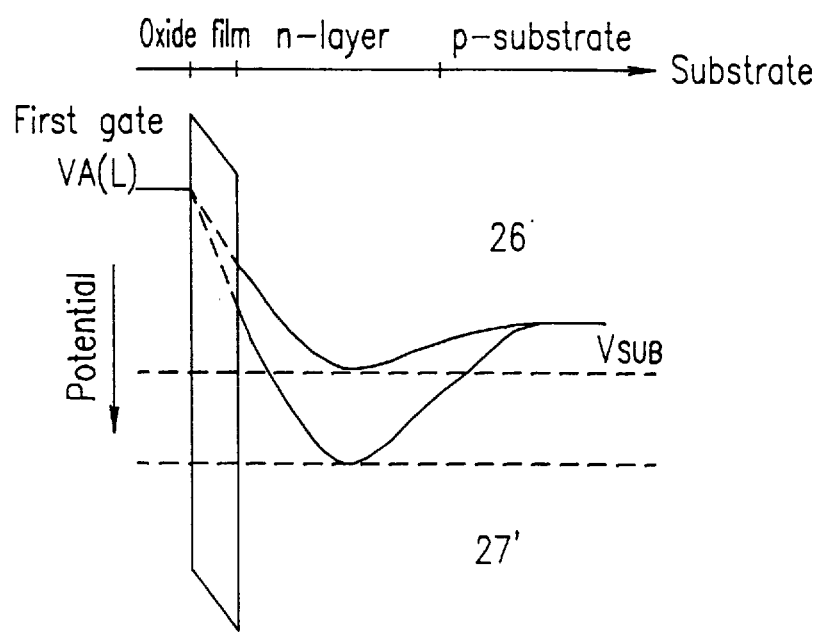
FIG. 9 is a potential distribution diagram illustrating a signal charge accumulation operation of a TGMIS amplification type solid-state imaging device shown with respect to the potential distribution in a portion under a first gate region along the depth direction.

Thus, because of the displacement ε (which is to be optimized in accordance with the specific usage of the device, the pixel size, the applied voltage, and the like) of the vertical center 8 of the source region 5 from the vertical pixel center 7 in the direction of the second gate electrode 3 (as shown in FIG. 2), the difference between the potential distribution 26 under the portion of the first gate electrode 2 between the source 5 and the second gate electrode 3, and the potential distribution 27 under the portion of the first gate electrode 2 between the source 5 and the drain 6 is reduced as compared with that inherent to the conventional device shown in FIG. 9. Specifically, the entire potential distribution 26 becomes deeper whereas the entire potential distribution 27 becomes shallower, thereby eliminating the difference in the semiconductor surface potential inherent to the conventional device shown in FIG. 9. As a result, the semiconductor surface potential under the portion of the first gate electrode 2 between the source 5 and the second gate electrode 3 coincides with the semiconductor surface potential under the portion of the first gate electrode 2 between the source 5 and the drain 6, as indicated by ⊚ in FIG. 2. Consequently, according to the present embodiment, a sensor output which is in accordance with the signal charge amount accumulated in the entire pixel is obtained to provide a device having excellent detection accuracy.

If the vertical center 8 of the source region 5 is located further closer to the second gate electrode 3 than is allowed by the optimum displacement $\epsilon$ (i.e., 0.4 $\mu$m in the present embodiment) from the pixel center 7, the semiconductor surface potential under the portion of the first gate electrode 2 between the source 5 and the second gate electrode 3 further deepens whereas the semiconductor surface potential under the portion of the first gate electrode 2 between the source 5 and the drain 6 further shallows, thereby resulting in some discrepancy in the surface potential. Therefore, it is desirable to displace the vertical center 8 of the source region 5 from the pixel center 7 by the optimum amount $\epsilon$ which is determined in accordance with the specific usage of the device, the pixel size, and the like.

Next, an advantage provided by the amplification type solid-state imaging device of the present invention during a reading operation is described by comparing FIGS. 3A and 3B. FIG. 3A is a potential distribution diagram illustrating a reading operation of the amplification type solid-state imaging device shown in FIGS. 1A and 1B, with respect to the potential distribution in a portion under the first gate region along the depth direction. FIG. 3B is a potential distribution diagram illustrating a reading operation of the conventional amplification type solid-state imaging device (previously proposed by the Applicant), with respect to the potential distribution in a portion under the first gate region along the depth direction. In FIG. 3A, the potential distribution under the portion of the first gate electrode 2 between the source 5 and the second gate electrode 3 is denoted as 30, whereas the potential distribution under the portion of the first gate electrode 2 between the source 5 and the drain 6 is denoted as 31. In FIG. 3B, potential distributions 30' and 31' correspond to the potential distributions 30 and 31 in FIG. 3A.

In the present embodiment, an intermediate voltage VA(H) (=0.0 V) is applied to the first gate electrode 2 and a relatively high gate voltage VB(H) (=5.0 V) is applied to the second gate electrode 2 during a reading operation. The value at the deepest point (i.e., the maximum value) of the semiconductor potential distribution under the first gate electrode 2 is detected as the source voltage.

In the case where it is preferable to decrease the voltage applied to the drain 6 in order to reduce the driving voltage and the power consumption of the amplification type solid-state imaging device, the potential under the currently-read first gate electrode 2 should be decreased in order to broaden the dynamic range (defined as the amplitude of the voltage which can be read by the device), since the detectable range of the source potential cannot exceed the drain voltage. As is apparent from the comparison of the potential distributions shown in FIGS. 3A and 3B, the displacement $\epsilon$ (i.e., 0.4 $\mu$m in the present embodiment) of the vertical center 8 of the source region 5 from the vertical pixel center 7 in the direction of the second gate electrode 3 effectively reduces the value at the deepest point (i.e., the maximum value) of the semiconductor potential distribution under the first gate electrode 2. As a result, in the case where a voltage of 5.0 V is applied to the drain 6, the dynamic range of the amplification type solid-state imaging device of the present invention is improved by 0.1 V as compared with the conventional device shown in FIG. 3B.

(Embodiment 2)

Figure 4A:
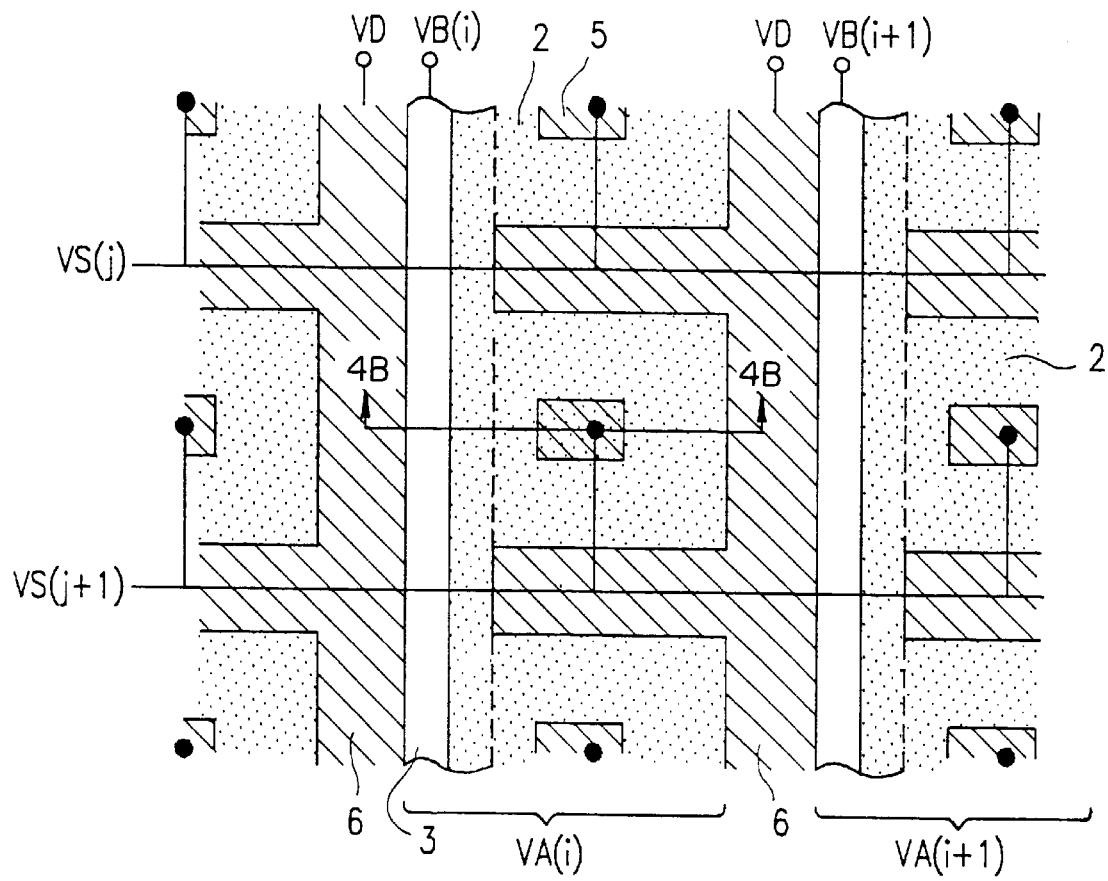
FIG. 4A is a schematic plan view showing another embodiment of an amplification type solid-state imaging device according to the present invention (where the relationship between the horizontal direction and the vertical direction is shown reversed, i.e., rotated by 90°).
Figure 4B:
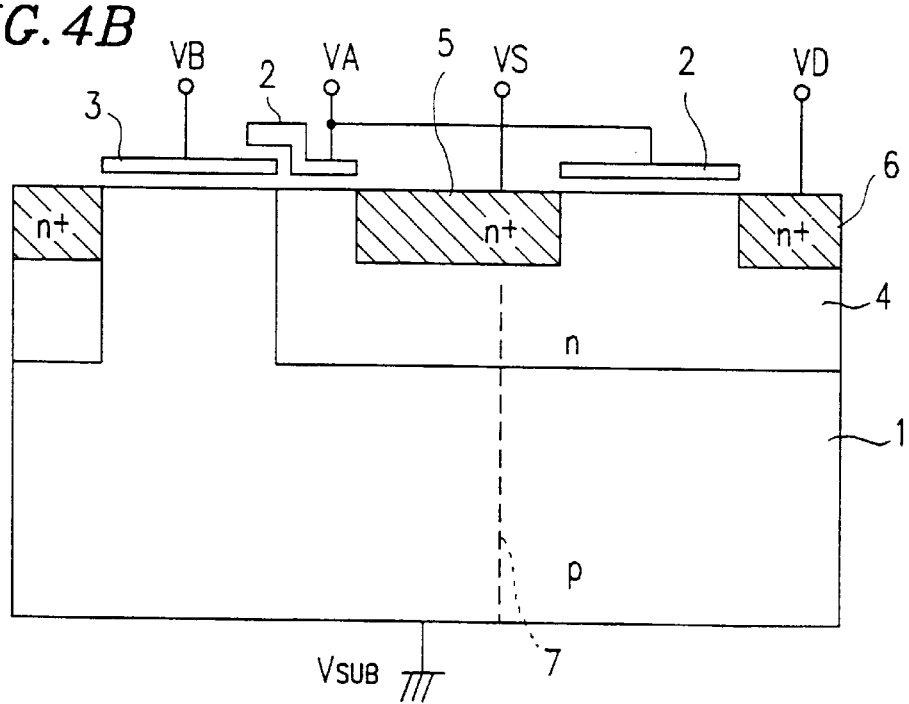
FIG. 4B is an enlarged cross-sectional view showing the amplification type solid-state imaging device in FIG. 4A taken at line B—B.

FIG. 4A is a schematic plan view showing another embodiment of an amplification type solid-state imaging device according to the present invention (where the relationship between the horizontal direction and the vertical direction is shown reversed, i.e., rotated by 90°). FIG. 4B is an enlarged cross-sectional view taken at line B—B in FIG. 4A. The reference numerals which correspond to those described in Embodiment 1 are denoted by the same reference numerals as used therein, and the description thereof is omitted.

In the amplification type solid-state imaging device of the present embodiment, the source region 5 in each pixel is formed so as to have a rectangular shape (as opposed to a square) as shown in FIG. 4A so that the distance between the pixel center 7 and the end of the source region 5 closer to the second gate region 3 is longer than the distance between the pixel center 7 and the opposite end of the source region 5. As a result, the semiconductor surface potential under the first gate electrode 2 becomes uniform.

In the present embodiment, the width of the portion of the first gate region 2 interposed between the source region 5 and the second gate region 3 is reduced from the conventional 1.5 $\mu$m to 0.8 $\mu$m, and correspondingly the source region 5 is elongated toward the second gate region 3 to obtain the rectangular-shaped source region 5 as opposed to the square source region 24 shown in FIG. 8A.

Figure 5:
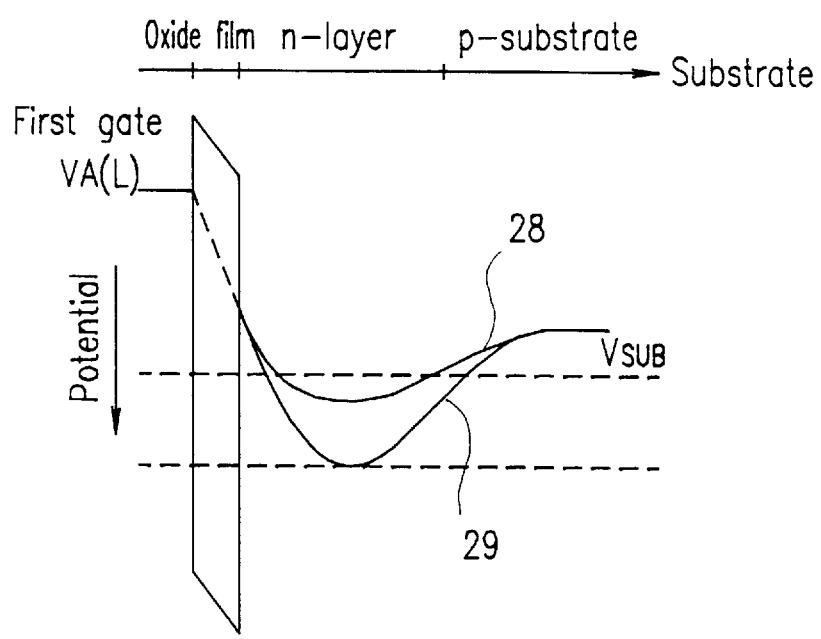
FIG. 5 is a potential distribution diagram illustrating a signal charge accumulation operation of the amplification type solid-state imaging device shown in FIGS. 4A and 4B, with respect to the potential distribution in a portion under a first gate region along the depth direction.
Figure 6A:
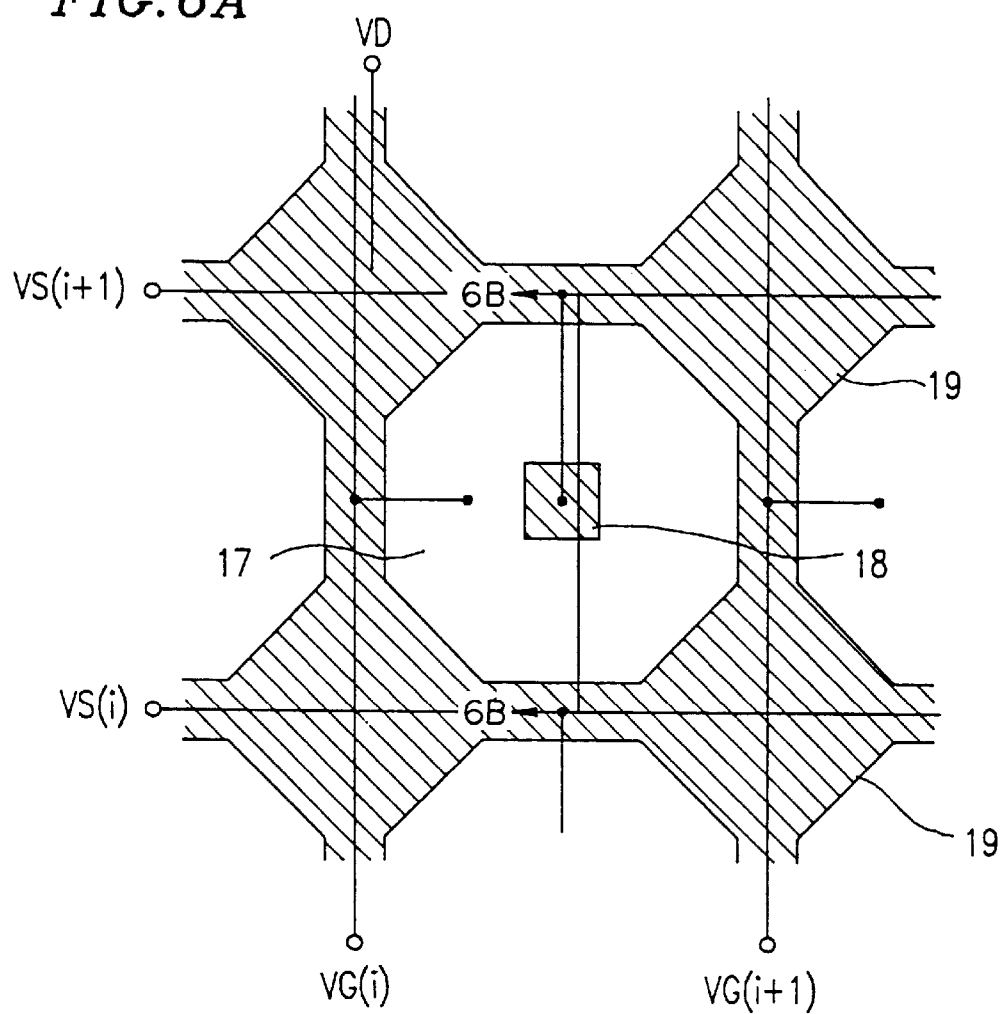
FIG. 6A is a schematic plan view showing a CMD type pixel (where relationship between the horizontal direction and the vertical direction is shown reversed, i.e., rotated by 90°).
Figure 6B:
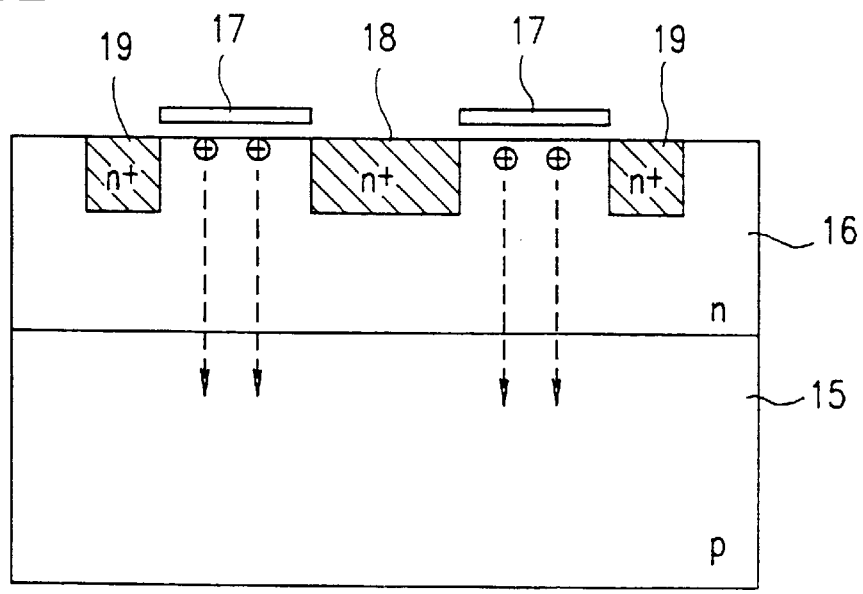
FIG. 6B is an enlarged cross-sectional view showing the CMD type pixel in FIG. 6A taken at line B—B.
Figure 7:
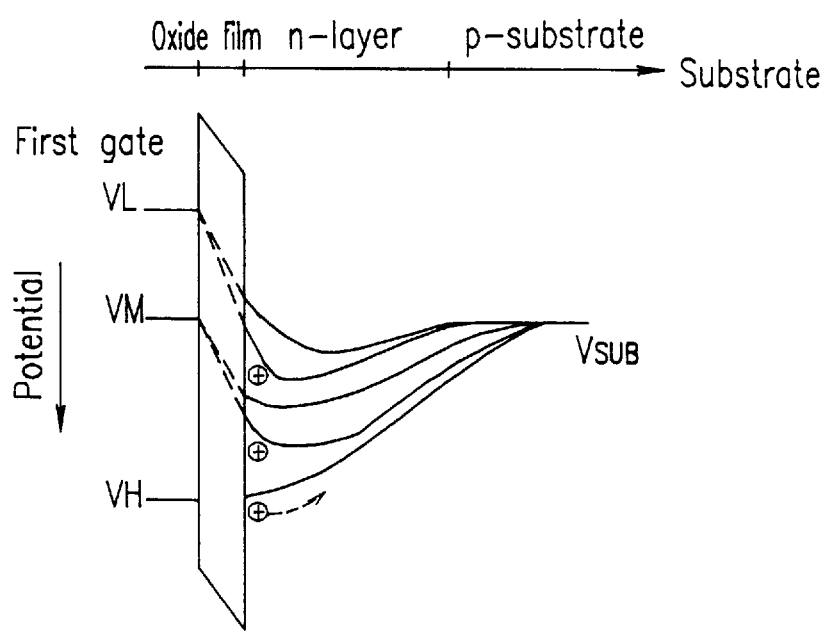
FIG. 7 is a potential distribution diagram illustrating the potential distribution along the depth direction of a CMD type pixel in a portion under a gate region.

In accordance with the device of the present embodiment, the source region 5 is elongated toward the second gate region 3 so that the portion of the source region 5 closer to the second gate region 3 is influenced by the drain 6 adjoining the second gate region 3. As a result, the semiconductor surface potential distribution 28 under the portion of the first gate electrode 2 between the source 5 and the second gate electrode 3 becomes deeper as shown in FIG. 5 so as to eliminate (as in Embodiment 1) the difference in the semiconductor surface potential inherent to the conventional device shown in FIG. 9 where the center of the source region 5 coincides with the pixel center 7. (Reference numeral 29 in FIG. 5 represents the semiconductor surface potential distribution under the portion of the first gate electrode 2 between the source 5 and the drain 6). As a result, the semiconductor surface potential under the first gate electrode 2 becomes uniform as shown in FIG. 5. Consequently, according to the present embodiment, a sensor output which is in accordance with the signal charge amount accumulated in the entire pixel is obtained to provide a device having excellent detection accuracy as in the case of Embodiment 1.

It is understood that the shape of the source region 5 is not limited to a rectangular shape, but can be optimized in accordance with the specific usage of the device, the pixel size, and the like as long as the distance between the pixel center 7 and the end of the source region 5 closer to the second gate region 3 is longer than the distance between the pixel center 7 and the opposite end of the source region 5 so that the semiconductor surface potential under the first gate electrode 2 becomes uniform. Accordingly, any shape other than a square centering around the pixel center 7 can be adopted in the present embodiment.

(Embodiment 3)

The present invention is applicable not only to the TGMIS amplification type solid-state imaging devices described in Embodiments 1 and 2 (illustrated in FIGS. 1A, 1B, 4A, and 4B), but also to amplification type solid-state imaging devices of other structures, as described in Embodiments 3, 4, and 5 of the present invention.

The present embodiment describes the application of the invention to a BDMIS (bulk drain MOS image sensor) type solid-state imaging device, which has been previously proposed by the Applicant in Japanese Patent Application No.7-51641.

Figure 10:
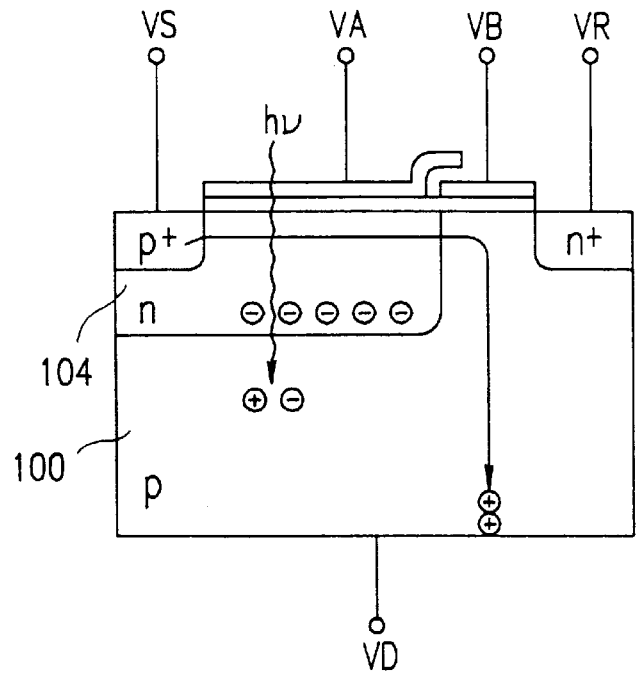
FIG. 10 a schematic cross-sectional view showing a BDMIS type solid-state imaging device.

FIG. 10 is a schematic cross-sectional view showing an exemplary BDMIS type solid-state imaging device. In this device, the signal charge (i.e., electrons in the present embodiment) generated by incident light is accumulated under a first gate electrode VA, and the potential under the first gate electrode VA changes in accordance with the accumulated signal charge. As a result, the current flowing between a source VS and a drain VD (i.e., holes in the present embodiment) changes, and the change in the current is output as a signal.

In comparison with a TGMIS type device, a BDMIS type device includes the following features: (a) a semiconductor substrate 100 functions as the drain VD; and (b) the signal charge is discharged to a reset drain VR via a second gate electrode VB on the surface of the semiconductor substrate 100.

FIG. 10 illustrates a case where the signal charge is electrons. It will be appreciated that the respective conductivities of the semiconductor layer 104 and the p+ layers (100, etc.) can be reversed in the case where the signal charge is holes.

Figure 11:
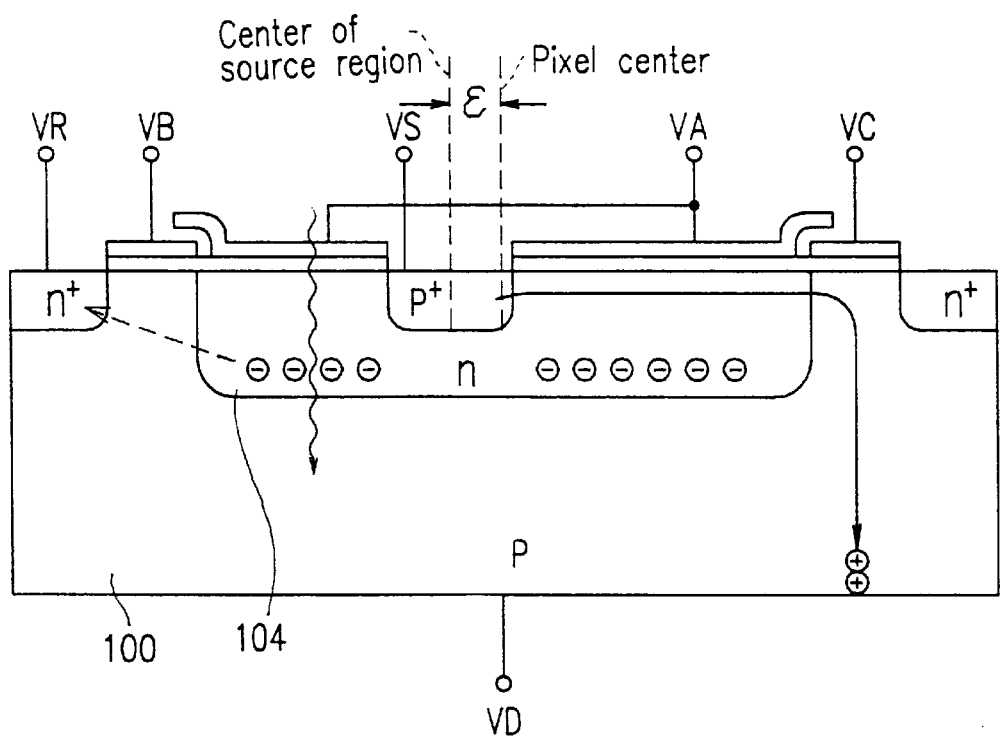
FIG. 11 is a schematic cross-sectional view showing still another embodiment of the amplification type solid-state imaging device according to the present invention.

FIG. 11 is a cross-sectional view showing an exemplary BDMIS type solid-state imaging device to which the present invention is applied. For conciseness, a cross-section of only one pixel is shown in FIG. 11. In this device, the center of the source region is displaced by $\epsilon$ from the pixel center (i.e., the center of a first gate electrode VA) in the left direction, i.e., toward a second gate electrode VB which is a signal reset gate. In other words, the source region 5 is displaced so that the potential under the first gate electrode VA where the signal charge is accumulated in the pixel becomes uniform.

The displacement $\epsilon$ may vary in accordance with the specific usage of the device, the pixel size, the applied voltage, and the like. For example, if the device is dimensioned so that the distance between the center and the ends of the first gate electrode VA is 1.5 $\mu$m, the appropriate displacement $\epsilon$ according to the present embodiment (as complying with the other conditions described herein) is about 0.2 $\mu$m.

In accordance with the BDMIS type solid-state imaging device of the present embodiment, the signal can be read by allowing a current flow in the semiconductor substrate 100 (functioning as the drain) via a third gate electrode VC. As seen from FIG. 11, the present embodiment is effective when applied to a BDMIS type solid-state imaging device such that the read current flows in only one direction along the surface of the semiconductor substrate 100 and eventually through the substrate 100.

Alternatively, the potential under the first gate electrode VA where the signal charge is accumulated in the pixel can be made uniform also by changing the shape of the source region as in Embodiment 2. This similarly applies to Embodiments 4 and 5 described below.

(Embodiment 4)

Figure 12:
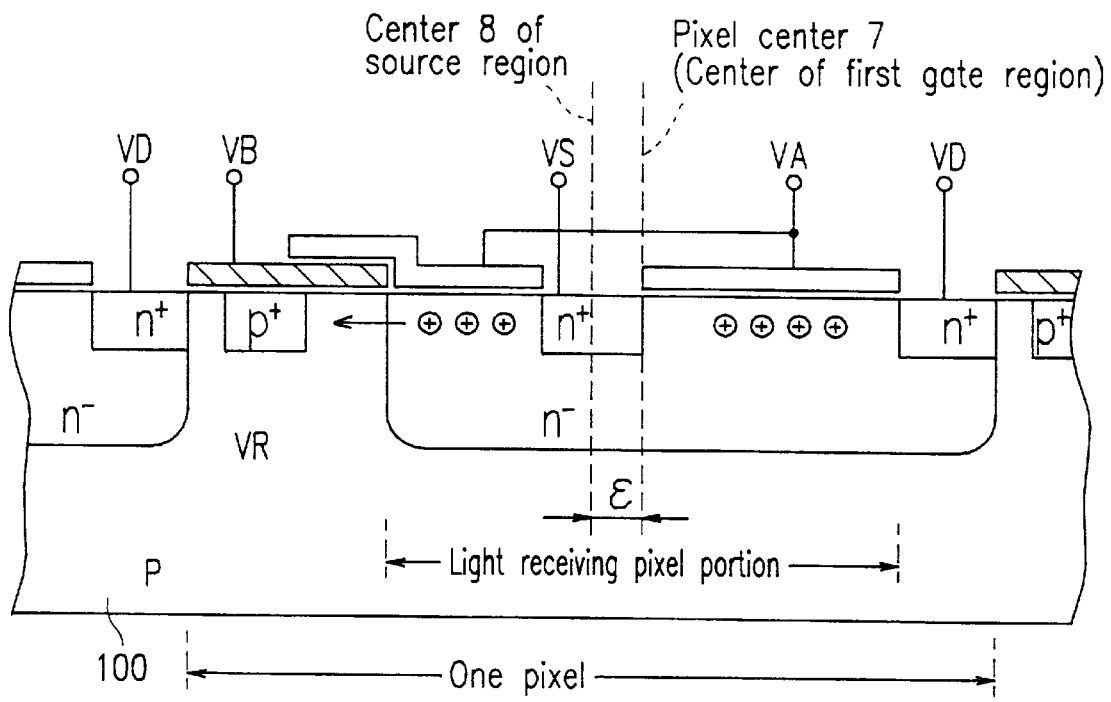
FIG. 12 is a schematic cross-sectional view showing still another embodiment of the amplification type solid-state imaging device according to the present invention.

FIG. 12 is a schematic cross-sectional view showing still another embodiment of the amplification type solid-state imaging device of the present invention. The present embodiment illustrates a case where the invention is applied to a surface reset TGMIS type solid-state imaging device previously proposed by the Applicant in Japanese Patent Application No.8-19199.

As shown in FIG. 12, the TGMIS type solid-state imaging device of the present embodiment differs from the TGMIS type amplification type solid-state imaging device proposed by the Applicant in Japanese Patent Application No.6-303953 in that a reset drain VR is provided on or near the surface of a substrate 100. In this device, the signal charge accumulated under a first gate electrode VA is discharged to the reset drain VR (on or near the surface of the substrate 100) via a second gate electrode VB, the reset drain VR being located under the second gate electrode VB adjoining the first gate electrode VA.

In this device, the center of the source region VS is displaced by $\epsilon$ from the center of the portion where the signal charge is accumulated (i.e., the center of the first gate electrode VA) toward the second gate electrode VB. Therefore, the potential under the first gate electrode VA where the signal charge is accumulated in the pixel is uniform. In the present embodiment, if the device is dimensioned so that the distance between the center and the ends of the first gate electrode VA is 1.5 $\mu$m, the appropriate displacement $\epsilon$ according to the present embodiment (as complying with the other conditions described herein) is about 0.4 $\mu$m. Thus, the displacement $\epsilon$ depends on the specific usage of the device, the pixel size, the applied voltage, and the like.

(Embodiment 5)

Figure 13:
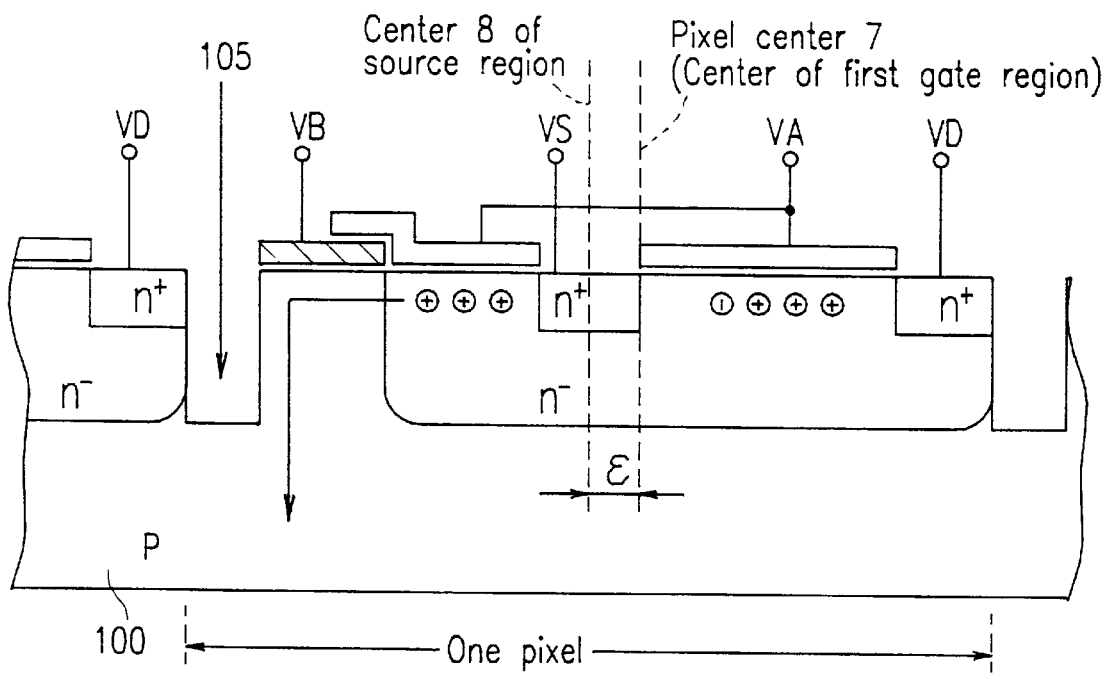
FIG. 13 is a schematic cross-sectional view showing still yet another embodiment of the amplification type solid-state imaging device according to the present invention.

FIG. 13 is a schematic cross-sectional view showing still another embodiment of the amplification type solid-state imaging device of the present invention. The present embodiment illustrates a case where the invention is applied to a TGMIS type solid-state imaging device previously proposed by the Applicant in Japanese Patent Application No.8-19200, in which an electric field obstruction means is provided on or near the surface of the substrate.

As shown in FIG. 13, the TGMIS type solid-state imaging device of the present embodiment differs from the TGMIS type amplification type solid-state imaging device proposed by the Applicant in Japanese Patent Application No.6-303953 in that an electric field obstruction means 105 (e.g., a trench structure) is provided on or near the surface of the semiconductor substrate 100 and its vicinity on the side of the second gate region opposite the adjoining first gate region.

The electric field obstruction means 105 functions to prevent the generation of a ridge in a middle portion of the potential distribution along the depth direction from the surface of the substrate 100 because such a ridge would hinder the signal reset operation. Consequently, the electric field obstruction means 105 enables the discharge of the signal charge to the substrate 100.

In this device, the center of the source region VS is displaced by $\epsilon$ from the center of the portion where the signal charge is accumulated (i.e., the center of the first gate electrode VA) toward the second gate electrode VB.

Therefore, the potential under the first gate electrode where the signal charge is accumulated in the pixel is uniform.

As described earlier, the source region is provided near the pixel center (i.e., the center of the source region completely or substantially coinciding with the pixel center) in the conventional TGMIS amplification type solid-state imaging device. The portion of the first gate region interposed between the source region and the second gate region (which is further away from the drain than the portion of the first gate electrode interposed between the source and the drain), receives a comparatively small influence from the voltage applied to the drain. As a result, the semiconductor surface potential taken under the portion of the first gate region interposed between the source region and the second gate region is lowered, thereby becoming liable for accumulating the signal charge (for example, holes). In other words, the semiconductor surface potential under the first gate electrode has unequal distributions. As a result, the semiconductor potential does not change so as to adequately reflect the signal charge amount accumulated in the entire pixel, indicative of a low sensitivity for the signal charge amount.

On the contrary, because of the displacement ε of the center 8 of the source region from the pixel center 7, the semiconductor surface potential under the first gate region becomes uniform as follows: By disposing a portion (one end) of the source region closer to the second gate region, the semiconductor surface potential under the portion of the first gate region interposed between the source region and the second gate region deepens due to an influence of the voltage applied to the drain of an adjoining pixel (the influence corresponding to the closeness to the second gate region), so that the above-mentioned non-uniformity in the surface potential is alleviated.

By thus optimizing the distance between the source region and the second gate region, it becomes possible to equalize the surface potential under the portion of the first gate region (first gate electrode) between the source region and the second gate region and the surface potential under the portion of the first gate region between the source region and the drain region. As a result, the semiconductor surface potential under the first gate region can be made uniform.

In order to substantially displace the source region from the pixel center, the present invention adopts at least one of the following two means: (i) locate the center of the source region so as to be displaced from the pixel center in the direction of the second gate region; and/or (ii) form the source region so as to have a shape such that the distance between the pixel center and the end of the source region closer to the second gate region is longer than the distance between the pixel center and the opposite end of the source region.

As a result, the signal charge is uniformly accumulated under the first gate region in each pixel so that a potential change which is in accordance with the signal charge amount accumulated in the entire pixel is obtained to provide a device having an excellent detection accuracy and having an improved sensor output sensitivity to the accumulated signal charge amount (for example, holes).

Moreover, disposing a portion (one end) of the source region away from the drain region serves to reduce the influence of the voltage applied to the drain on the semiconductor under the portion of the first gate region interposed between the source region and the drain region, and thereby decreases the maximum value of the potential distribution along the depth direction of the substrate. As a result, the potential of the MOS transistor, detected in the form of the source potential, becomes small. Now, the detectable range of the source potential cannot exceed the voltage applied to the drain. Accordingly, if only a low constant voltage can be applied to the drain so that the detectable voltage is limited by the low constant voltage, the dynamic range (defined as the amplitude of the voltage which can be read by the device) can still be improved by decreasing the maximum value of the potential distribution in the substrate by displacing the center of the source region from the pixel center, that is, disposing a portion (one end) of the source region away from the drain region, according to the present invention.

By applying the amplification type solid-state imaging device of the present invention, an amplification type solid-state imaging device having a low driving voltage and small power consumption and yet excellent pixel characteristics can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An amplification type solid-state imaging device, comprising:

a first gate region functioning as a photoelectric conversion region, a second gate region, and a source region, the first gate region surrounding the source region, and the second gate region adjoining the first gate region on a side opposite the source region, to discharge signal charge accumulated in the first gate region through the second gate region;

wherein a center of the source region is displaced from a center of a pixel.

2. An amplification type solid-state imaging device according to claim 1, wherein the first gate region is a portion of a transistor formed on or near a surface of a semiconductor substrate, the transistor outputting a change in an electric signal in accordance with the accumulated signal charge generated through a photoelectric conversion;

the second gate region being formed on the surface of the semiconductor substrate; and resetting of the signal charge in the second gate region occurring inside the semiconductor substrate.

3. An amplification type solid-state imaging device according to claim 1, wherein the first gate region is a portion of a transistor formed on or near a surface of a semiconductor substrate, the transistor outputting a change in an electric signal in accordance with the accumulated signal charge generated through a photoelectric conversion;

the second gate region being formed on the surface of the semiconductor substrate;

a reset drain being provided on or near the surface of the semiconductor substrate at an end adjoining the second gate region;

resetting of the signal charge occurring in the reset drain via the second gate region; and the change in the electric signal being output by the transistor based on change occurring in a current flowing between the source region and the semiconductor substrate, the semiconductor substrate functioning as a drain.

4. An amplification type solid-state imaging device according to claim 1, wherein the first gate region is a portion of a transistor formed on or near a surface of a semiconductor substrate, the transistor outputting a change in an electric signal in accordance with the accumulated signal charge generated through a photoelectric conversion;

the second gate region being formed on the surface of the semiconductor substrate; and a reset drain being provided on or near the surface of the semiconductor substrate within the second gate region.

5. An amplification type solid-state imaging device according to claim 1, wherein an electric field obstruction element is formed on or near the surface of the semiconductor substrate and its vicinity on a side of the second gate region opposite the adjoining first gate region.

6. An amplification type solid-state imaging device according to claim 1, wherein the center of the source region is displaced from the center of the pixel toward the second gate region.

7. An amplification type solid-state imaging device according to claim 2, wherein the center of the source region is displaced from the center of the pixel toward the second gate region.

8. An amplification type solid-state imaging device according to claim 3, wherein the center of the source region is displaced from the center of the pixel toward the second gate region.

9. An amplification type solid-state imaging device according to claim 4, wherein the center of the source region is displaced from the center of the pixel toward the second gate region.

10. An amplification type solid-state imaging device according to claim 5, wherein the center of the source region is displaced from the center of the pixel toward the second gate region.

11. An amplification type solid-state imaging device according to claim 1, wherein the source region has a shape such that a distance between the center of the pixel and of the source region closer to the second gate region is longer than a distance between the center of the pixel and the opposite end of the source region.

12. An amplification type solid-state imaging device according to claim 2, wherein the source region has a shape such that a distance between the center of the pixel and of the source region closer to the second gate region is longer than a distance between the center of the pixel and the opposite end of the source region.

13. An amplification type solid-state imaging device according to claim 3, wherein the source region has a shape such that a distance between the center of the pixel and of the source region closer to the second gate region is longer than a distance between the center of the pixel and the opposite end of the source region.

14. An amplification type solid-state imaging device according to claim 4, wherein the source region has a shape such that a distance between the center of the pixel and of the source region closer to the second gate region is longer than a distance between the center of the pixel and the opposite end of the source region.

15. An amplification type solid-state imaging device according to claim 5, wherein the source region has a shape such that a distance between the center of the pixel and of the source region closer to the second gate region is longer than a distance between the center of the pixel and the opposite end of the source region.

* * * * *

UNITED STATES PATENT AND TRADEMARK OFFICE
CERTIFICATE OF CORRECTION

PATENT NO. : 5,844,234     Page 1 of 2
DATED     : Dec. 1, 1998
INVENTOR(S) : H. Kawazoe It is certified that error appears in the above-identified patent and that said Letters Patent is hereby corrected as shown below:

<u>IN THE DRAWINGS:</u>

In Fig. 13, to the left of the rightmost n+, please delete " ⊕ ⊖ ⊖ ⊖ ", and substitute therefor: -- ⊖ ⊖ ⊖ ⊖ -- as shown in the corrected Fig. 13 below.

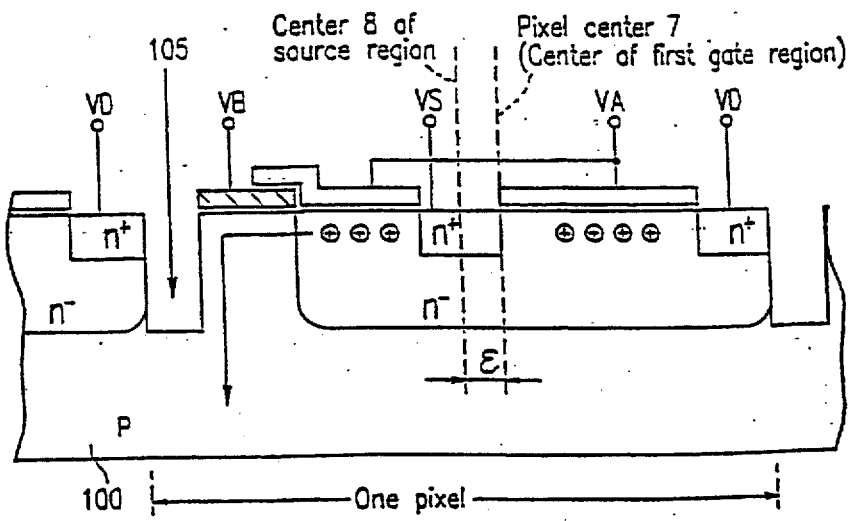

UNITED STATES PATENT AND TRADEMARK OFFICE
CERTIFICATE OF CORRECTION

PATENT NO. : 5,844,234
DATED : Dec. 1, 1998
INVENTOR(S) : H. Kawazoe

It is certified that error appears in the above-identified patent and that said Letters Patent is hereby corrected as shown below:

At column 9, line 2, please delete "(as shown in FIG. 2)".

At column 9, line 8, after "FIG. 9." but before the period, please insert: --(as shown in FIG. 2).--.

At column 9, line 56, please delete "VA(H)" and substitute therefor: --VA(M)--.

Signed and Sealed this

Tenth Day of August, 1999

Attest:

Q. TODD DICKINSON

*Attesting Officer*    *Acting Commissioner of Patents and Trademarks*